(12) United States Patent
Takayanagi et al.

(10) Patent No.: US 12,184,078 B2
(45) Date of Patent: Dec. 31, 2024

(54) ELECTROMAGNETIC INDUCTION POWER GENERATOR

(71) Applicant: TDK Corporation, Tokyo (JP)

(72) Inventors: Yoshinobu Takayanagi, Tokyo (JP); Akihiro Unno, Tokyo (JP); Saiki Shigemori, Tokyo (JP)

(73) Assignee: TDK Corporation, Tokyo (JP)

( * ) Notice: Subject to any disclaimer, the term of this patent is extended or adjusted under 35 U.S.C. 154(b) by 76 days.

(21) Appl. No.: 17/767,668

(22) PCT Filed: Dec. 4, 2020

(86) PCT No.: PCT/JP2020/045210
§ 371 (c)(1),
(2) Date: Apr. 8, 2022

(87) PCT Pub. No.: WO2021/131604
PCT Pub. Date: Jul. 1, 2021

(65) Prior Publication Data
US 2022/0247210 A1    Aug. 4, 2022

(30) Foreign Application Priority Data
Dec. 24, 2019    (JP) ................... 2019-232726

(51) Int. Cl.
*H02J 50/00* (2016.01)
*H02J 50/10* (2016.01)
*H02M 7/06* (2006.01)

(52) U.S. Cl.
CPC ............ *H02J 50/001* (2020.01); *H02J 50/10* (2016.02); *H02M 7/06* (2013.01)

(58) Field of Classification Search
CPC .......... H02J 50/001; H02J 50/10; H02M 7/06
See application file for complete search history.

(56) References Cited

U.S. PATENT DOCUMENTS

2016/0063329 A1    3/2016    Koo et al.

FOREIGN PATENT DOCUMENTS

| JP | 11-032480 A | 2/1999 |
| JP | 2001-314084 A | 11/2001 |

(Continued)

OTHER PUBLICATIONS

International Search Report issued in corresponding International Patent Application No. PCT/JP2020/045210, dated Jan. 26, 2021, with English translation.

*Primary Examiner* — Daniel Cavallari
(74) *Attorney, Agent, or Firm* — Rimon P.C.

(57) ABSTRACT

An electromagnetic induction power generator includes a magnetic core attachable to a power transmission/distribution line, a power generating coil wound around the magnetic core, and a switching power supply circuit that converts AC appearing at both ends of the power generating coil into DC. The switching power supply circuit stops its switching operation based on a DC voltage level. The stop of the switching operation increases reactive power, allowing a stable power generating operation, i.e., a stable supply of active power irrespective of the amount of current flowing through the power transmission/distribution line. In addition, the amount of the reactive power can be finely adjusted based on the length of a period during which the switching operation is stopped, allowing a finer control of the reactive power.

5 Claims, 5 Drawing Sheets

(56) References Cited

FOREIGN PATENT DOCUMENTS

| | | |
|---|---|---|
| JP | 2007-093342 A | 4/2007 |
| JP | 2016-517261 A | 6/2016 |
| JP | 6351884 B1 | 7/2018 |
| WO | WO-2018193661 A1 * | 10/2018 .............. H02J 13/00 |

* cited by examiner

ELECTROMAGNETIC INDUCTION POWER GENERATOR

CROSS REFERENCE TO RELATED APPLICATIONS

This application is the U.S. National Phase under 35 US.C. § 371 of International Application No. PCT/JP2020/045210, filed on Dec. 4, 2020, which claims the benefit of Japanese Application No. 2019-232726, filed on Dec. 24, 2019, the entire contents of each are hereby incorporated by reference.

TECHNICAL FIELD

The present invention relates to an electromagnetic induction power generator used for a power transmission/distribution line monitoring system.

BACKGROUND ART

There is known a monitoring device which is attached to a power transmission/distribution line and monitors the state thereof. A power transmission/distribution line monitoring system using this monitoring device includes a slave unit that monitors the state of a power transmission/distribution line and transmits data thereof, another slave unit that is set up on a transmission tower and transmits weather data, and a master unit that accumulates the data and transmits all the accumulated data to a monitoring center for controlling a power transmission/distribution line current capacity. The power transmission/distribution line monitoring system is used for dynamic line rating that monitors states of the power transmission/distribution line (such as current, voltage, tension, inclination angle, height, temperature, and corona discharge) and weather and environment conditions around the power line, computes as needed a change in the temperature of the power transmission/distribution line due to factors such as maintenance therefor, current flowing therethrough, and external environment therearound, and dynamically calculates/manages the power transmission/distribution line current capacity.

For example, Patent Document 1 describes a vibration detection device for detecting abnormal vibration of a power transmission line. The vibration detection device uses, as a power supply therefor, a power generator using electromagnetic induction caused by a change in a magnetic field generated around the power transmission line or a solar power generator.

Patent Document 2 describes a monitoring camera system using a power supply of an electromagnetic induction type. The monitoring camera system is detachably attached to a power transmission/distribution line and has a power generation CT core that generates power by an electromagnetic induction system, a power conversion part that converts an AC power generated from the power generation CT core into a DC power, a camera module for capturing a moving image, and a wireless communication module that transmits the output data from the camera module to the outside.

CITATION LIST

Patent Document

[Patent Document 1] JP 2007-093342A
[Patent Document 2] JP-T 2016-0517261
[Patent Document 3] Japanese Patent No. 6351884

SUMMARY OF THE INVENTION

Problem to be Solved by the Invention

Figure 6:
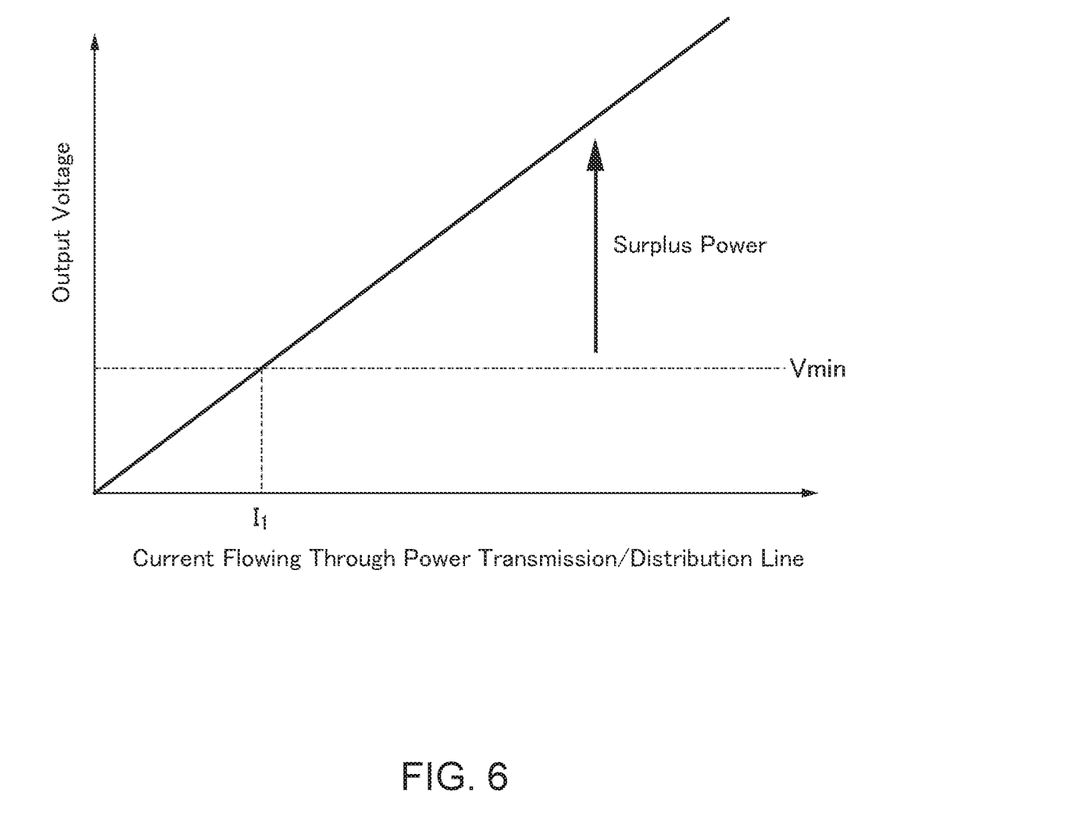
FIG. 6 is an explanatory view of the operation of a conventional electromagnetic induction power generator, which is a graph illustrating the relation between current flowing through a power transmission/distribution line and output voltage of the electromagnetic induction power generator.

As illustrated in FIG. 6, a current flowing through a power transmission/distribution line significantly fluctuates depending on power demand. To make the monitoring device operate stably despite fluctuation in the current flowing through the power transmission/distribution line, it is necessary to make an electromagnetic induction power generator always generate a minimum power Vmin required for enabling the monitoring device to operate even when the current flowing through the power transmission/distribution line assumes a minimum value $I_1$.

In the electromagnetic induction power generator that generates power using the current flowing through the power transmission/distribution line, a secondary current increases with an increase in the current flowing through the power transmission/distribution line. Thus, as illustrated in FIG. 6, when a very large current flows through the power transmission/distribution line, power to be generated also becomes very large. Assuming that the monitoring device operates with constant power consumption even though the power generation amount thus increases, a large amount of surplus power is generated. Thus, there occurs a necessity of consuming this surplus power in some way, such as conversion into heat.

However, the conversion of the surplus power into heat leads to an unnecessary temperature rise in the monitoring device, which may accelerate degradation of components or elements constituting the monitoring device. Further, a large current of several thousands of amperes or more may flow through a high-voltage power transmission line and, in this case, it is extremely difficult to completely convert the surplus power generated by the large current into heat. Furthermore, when the monitoring device is used on an overhead power transmission line or an underground transmission line, the installation and maintenance thereof are very difficult, so that monitoring devices, once installed in such a location, are required to operate stably for a long period of time, e.g., 10 years or more from the installation. Considering this, it is desirable to minimize degradation in characteristics due to high temperature or the like of the monitoring device.

Patent Document 3 proposes a method of controlling reactive power by an impedance mismatch unit which is provided between a power generating coil and a rectifying circuit to stabilize power generating operation irrespective of the amount of current flowing through a power transmission line. However, the method proposed in Patent Document 3 requires the impedance mismatch unit including a plurality of capacitors and a plurality of switches in addition to a switching power supply circuit, disadvantageously increasing circuit scale. Further, the impedance that can be controlled by the impedance mismatch unit is discrete, failing to linearly control the reactive power.

It is therefore an object of the present invention to provide an electromagnetic induction power generator capable of performing stable power generating operation, i.e., stably supplying active power irrespective of the amount of current flowing through a power transmission/distribution line by finely controlling the reactive power, while suppressing an increase in circuit scale caused by implementing a phase advance capacitor, a capacitor capacitance switch unit, and the like.

Means for Solving the Problem

To solve the above problems, an electromagnetic induction power generator according to the present invention includes: a magnetic core attachable to a power transmission/distribution line; a generating coil wound around the magnetic core; and a switching power supply circuit that converts AC power appearing at both ends of the generating coil into DC power. The switching power supply circuit stops its switching operation based on the voltage level of DC power.

According to the present invention, reactive power can be increased by stopping the switching operation, so that it is possible to perform a stable power generating operation, i.e., to stably supply active power irrespective of the amount of current flowing through the power transmission/distribution line. In addition, the reactive power is finely adjusted in amount based on the length of a period during which the switching operation is stopped, so that it is possible to control the reactive power more precisely.

In the present invention, the switching power supply circuit may intermittently perform the switching operation in response to a DC voltage level exceeding a first predetermined value to increase the reactive power. This reduces active power when the a voltage level of the DC power exceeds the first predetermined value, so that the amount of power generation can be suppressed even when the amount of current flowing through the power transmission/distribution line is large.

In the present invention, the switching power supply circuit may include a rectifying circuit that rectifies the AC power into a pulsating voltage and may stop the switching operation in a period during which the voltage level of the pulsating voltage exceeds a second predetermined value in response to the voltage level of the DC power exceeding the first predetermined value. With this configuration, the switching operation is stopped in a period during which the amount of current flowing through a load is large, thus making it possible to effectively suppress the amount of power generation.

In the present invention, the switching power supply circuit may include a voltage converting circuit that converts the voltage level of the DC power and supplies the resultant DC to an IoT device, and the switching power supply circuit may adjust the reactive power such that the total of power loss of the voltage converting circuit and load power consumed by the IoT device is equal to the active power. This prevents generation of surplus power, allowing heat generation to be minimized.

In the present invention, the magnetic core may include a first magnetic core attachable to a first power transmission/distribution line and a second magnetic core attachable to a second power transmission/distribution line, the generating coil may include a first generating coil wound around the first magnetic core and a second generating coil wound around the second magnetic coil, and the switching power supply circuit may synthesize and convert AC power appearing at both ends of each of the first and second generating coils into DC power. With this configuration, even when power is not supplied from one of the power transmission/distribution lines, stable power generating operation, i.e., stable supply of active power can be continued.

In this case, the phases of the AC appearing at both ends of the first generating coil and AC appearing at both ends of the second generating coil may differ from each other. As a result, ACs differing in phase are synthesized, so that more stable DC can be obtained.

A power transmission/distribution line monitoring system according to the present invention includes: an electromagnetic induction power generator having the above-mentioned feature of the present invention; and an IoT device that monitors a power transmission/distribution line through DC. According to the present invention, a desired power can be generated even when a primary current flowing through the power transmission/distribution line is very small, whereby power can be stably supplied to the IoT device including a sensor, a control circuit, a communication unit, and the like. Further, when the primary current is very large, an increase in output voltage from a secondary winding is not proportional to the primary current and is thus suppressed, so that it is possible to suppress the occurrence of surplus power and thus to prevent unnecessary temperature rise due to conversion of surplus power into heat. This can prevent degradation in performance of the IoT device that receives power supply.

Advantageous Effects of the Invention

According to the present invention, there can be provided an electromagnetic induction power generator capable of performing a stable power generating operation, i.e., stably supplying active power irrespective of the amount of current flowing through a power transmission/distribution line by finely controlling the reactive power, while suppressing an increase in circuit scale caused by implementing a phase advance capacitor, a capacitor capacitance switch unit, and the like.

MODE FOR CARRYING OUT THE INVENTION

Hereinafter, preferred embodiments of the present invention will be described in detail with reference to the accompanying drawings.

First Embodiment

Figure 1:
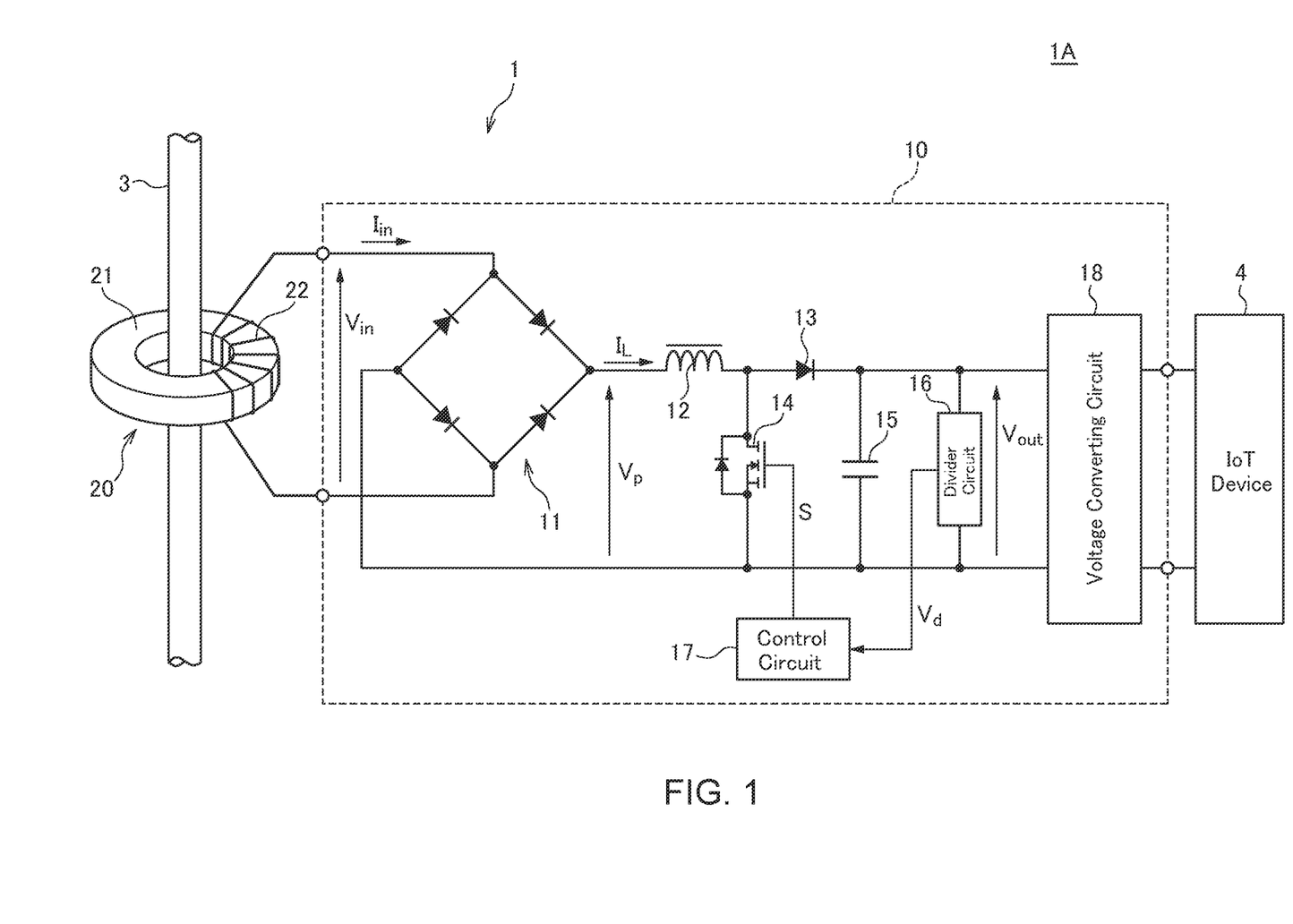
FIG. 1 is a view schematically illustrating the configuration of a power transmission/distribution line monitoring system 1A according to a first embodiment of the present invention.

FIG. 1 is a view schematically illustrating the configuration of a power transmission/distribution line monitoring system 1A according to a first embodiment of the present invention.

As illustrated in FIG. 1, the power transmission/distribution line monitoring system 1A according to the first embodiment has an electromagnetic induction power generator 1 that generates power with current flowing through a power transmission/distribution line 3 and an IoT device 4 that receives power from the electromagnetic induction power generator 1 and monitors the power transmission/distribution line 3. The electromagnetic induction power generator 1 serves as a power source for the IoT device 4, and the IoT device 4 is connected to an output terminal of the electromagnetic induction power generator 1. The IoT device 4 is not particularly limited in type and may be any of various sensor modules that can measure the physical or electrical state of the power transmission/distribution line 3 or a remote monitor camera, etc. The IoT device 4 has a communication function and thus can transmit data collected by the sensor or camera to a server.

The power transmission/distribution line 3 is preferably an overhead power transmission line and, more preferably, a high-voltage power transmission line that feeds power at 66 kV or more. In this case, the overhead power transmission line is installed at a high place of several tens of meters from the ground, and an underground transmission line is installed in a service tunnel, a road tunnel, or a manhole, so that the installation and maintenance of the power transmission/distribution line monitoring system 1A including the electromagnetic induction power generator 1 and IoT device 4 are extremely difficult, and the fluctuation range (dynamic range) of the current flowing through the power transmission/distribution line 3 is as very wide as 50 A to 3000 A. Owing to the above reasons, the effect of the present invention is remarkable. An AC current with a commercial frequency (50 Hz or 60 Hz) flows through the power transmission/distribution line 3, and an alternating magnetic field is generated around the power transmission/distribution line 3. The magnitude of the alternating magnetic field changes depending on the magnitude of the current flowing through the power transmission/distribution line 3.

The electromagnetic induction power generator 1 has a current transformer 20 attached to the power transmission/distribution line 3 and a switching power supply circuit 10 connected to the current transformer 20. The current transformer 20 has a magnetic core 21 attached to the power transmission/distribution line 3 as a primary winding and a power generating coil 22 magnetically coupled to the power transmission/distribution line 3 through the magnetic core 21. The magnetic core 21 is, e.g., a divided toroidal core and is attached to the power transmission/distribution line 3 so as to allow the power transmission/distribution line 3 to pass through the hollow portion of the toroidal core. The power generating coil 22 is a secondary winding wound around the magnetic core 21 in a predetermined number of turns, and both ends of the power generating coil 22 are connected to a pair of input terminals of the switching power supply circuit 10.

The switching power supply circuit 10 is a circuit that converts AC, i.e., apparent power appearing at both ends of the power generating coil 22 into DC and has a rectifying circuit 11, a choke coil 12, a diode 13, a transistor 14, a capacitor 15, a divider circuit 16, a control circuit 17, and a voltage converting circuit 18. As illustrated in FIG. 1, the choke coil 12 and the diode are connected in series to each other, and the transistor 14 and the capacitor 15 are connected in parallel to each other. The rectifying circuit 11 converts an AC voltage Vin appearing at both ends of the power generating coil 22 into a pulsating voltage Vp. The pulsating voltage Vp output from the rectifying circuit 11 is subjected to high frequency switching at a frequency higher than a commercial frequency by the choke coil 12 and transistor 14 and converted into a DC voltage Vout by the diode 13 and capacitor 15. The DC voltage Vout is then converted into a desired DC voltage by the voltage converting circuit 18, and the obtained DC voltage is output to the IoT device 4.

The divider circuit 16 generates a detection voltage Vd by dividing the output voltage Vout. The control circuit 17 generates a switching signal S based on the detection voltage Vd output from the divider circuit 16. The switching signal S is supplied to the transistor 14 to control ON/OFF of the transistor 14.

Figure 2:
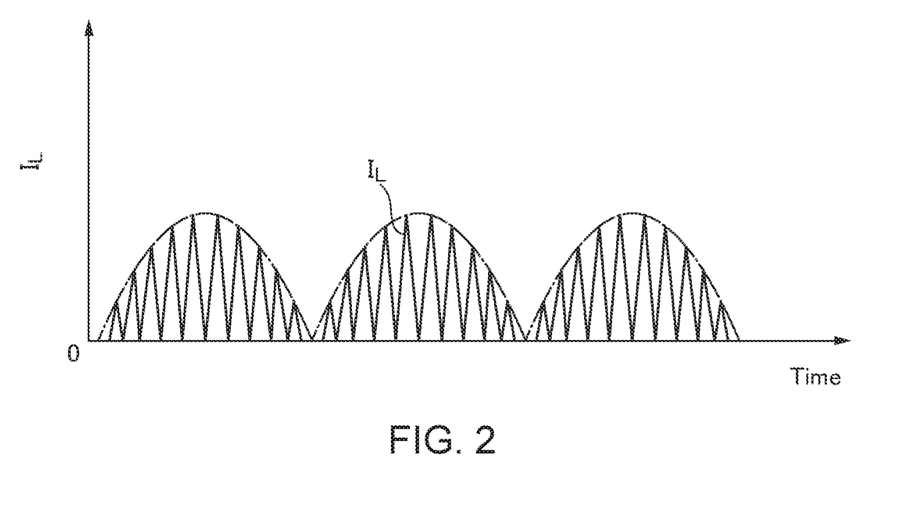
FIG. 2 is a waveform diagram illustrating a change in an inductor current IL when switching operation is continuously performed.
Figure 3:
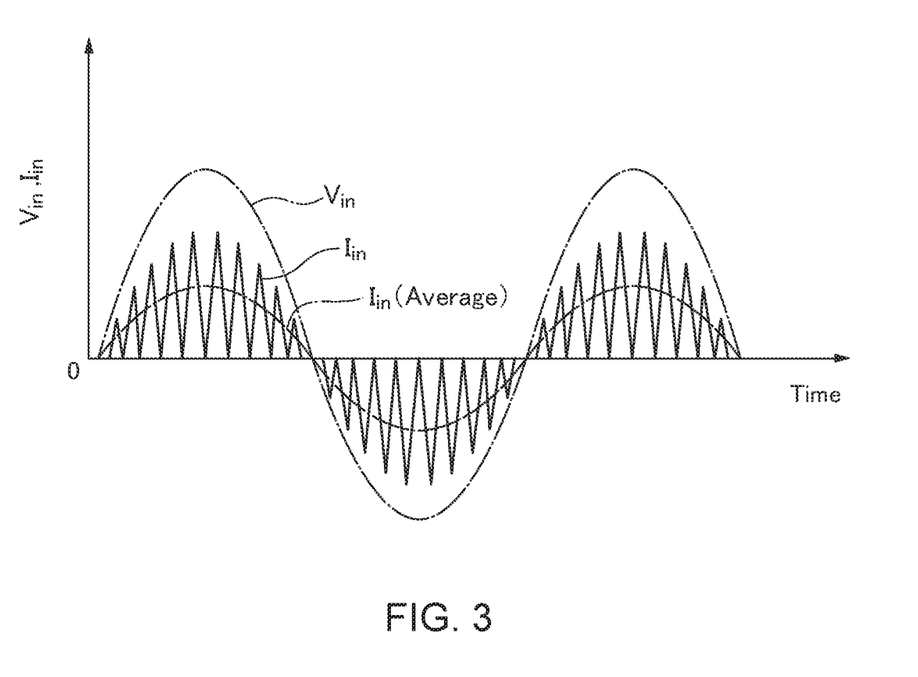
FIG. 3 is a waveform diagram illustrating changes in an input voltage Vin and an input current Iin.

FIG. 2 is a waveform diagram illustrating a change in an inductor current IL, and FIG. 3 is a waveform diagram illustrating changes in input voltage Vin and input current Iin.

As illustrated in FIG. 2, the control circuit 17 performs switching control such that the envelope of the waveform of the inductor current IL becomes a pulsating voltage. The ON/OFF control of the transistor 14 by the control circuit 17 may be a current critical mode control or a current continuous mode control. As a result, as illustrated in FIG. 3, the input current Iin has the same phase as the temporally changing input voltage Vin, whereby the power factor is improved. Thus, when the current flowing through the power transmission/distribution line 3 is small, the power factor is increased to roughly one by the switching operation, thus achieving efficient power generation.

However, when the increased power factor is maintained in a state where the current flowing through the power transmission/distribution line 3 is large, the output voltage Vout becomes excessively high, which may cause breakage of the voltage converting circuit 18 and IoT device 4 due to overvoltage or may generate heat by surplus power that cannot be consumed. Thus, when the current flowing through the power transmission/distribution line 3 is large, reactive power is increased by stopping the switching operation to reduce active power so as to prevent an increase in the output voltage Vout. Whether or not the control circuit 17 stops the switching operation of the transistor 14 is determined based on the detection voltage Vd output from the divider circuit 16. For example, when the detection voltage Vd is equal to or less than a predetermined value, the switching operation may be performed, while when the detection value Vd exceeds the predetermined value, the switching operation may be stopped.

The reactive power is preferably controlled by the control circuit 17 such that the total of power loss of the voltage converting circuit 18 and load power consumed by the IoT device 4 is equal to the active power. This prevents generation of surplus power, allowing heat generation to be minimized.

Figure 4:
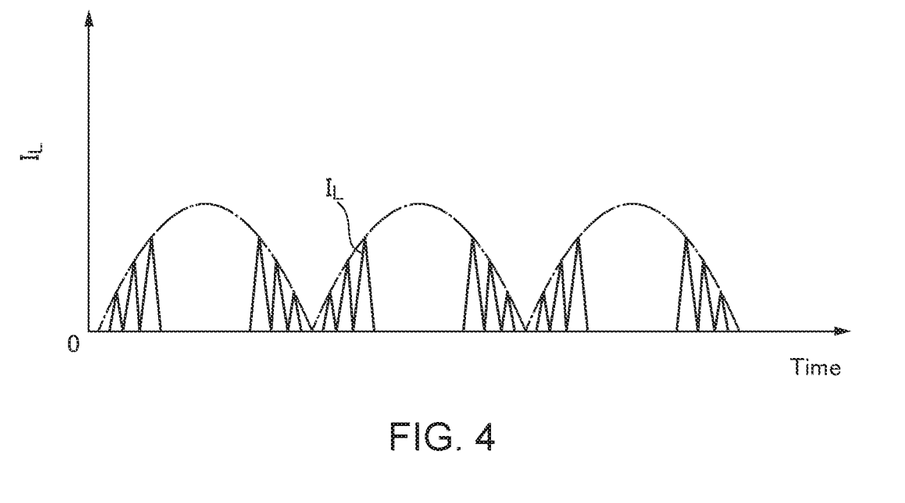
FIG. 4 is a waveform diagram illustrating a change in the inductor current IL when switching operation is intermittently performed.

The stop and resume of the switching operation may be determined simply based on whether or not the detection value Vd exceeds a predetermined value. Alternatively, the switching operation may be intermittently performed in response to the detection value Vd exceeding a predetermined value to increase the reactive power. In this case, as illustrated in FIG. 4, the switching operation may be stopped in the vicinity of the peak of the pulsating voltage Vp.

Accordingly, the switching operation is stopped in a period during which the inductor current IL is large, so that the reactive power is further increased to effectively reduce the active power. The period during which the switching operation is stopped may be set to a period during which the pulsating voltage Vp exceeds a predetermined value and can be finely adjusted by changing the predetermined value in accordance with the level of the detection value Vd.

As described above, the power transmission/distribution line monitoring system 1A has the electromagnetic induction power generator 1 that supplies power to the IoT device 4. The electromagnetic induction power generator 1 increases the power factor by performing the switching operation when the current flowing through the power transmission/distribution line 3 is small to thereby efficiently generate power, while it stops the switching operation when the current flowing through the power transmission/distribution line 3 is large to thereby increase the reactive power. This makes it possible to obtain stable active power irrespective of the amount of current flowing through the power transmission/distribution line 3. In addition, the reactive power is adjusted through control of the switching operation, so that it is possible to control the reactive power more finely while suppressing an increase in circuit scale caused by implementing a phase advance capacitor, a capacitor capacitance switch unit, and the like.

Second Embodiment

Figure 5:
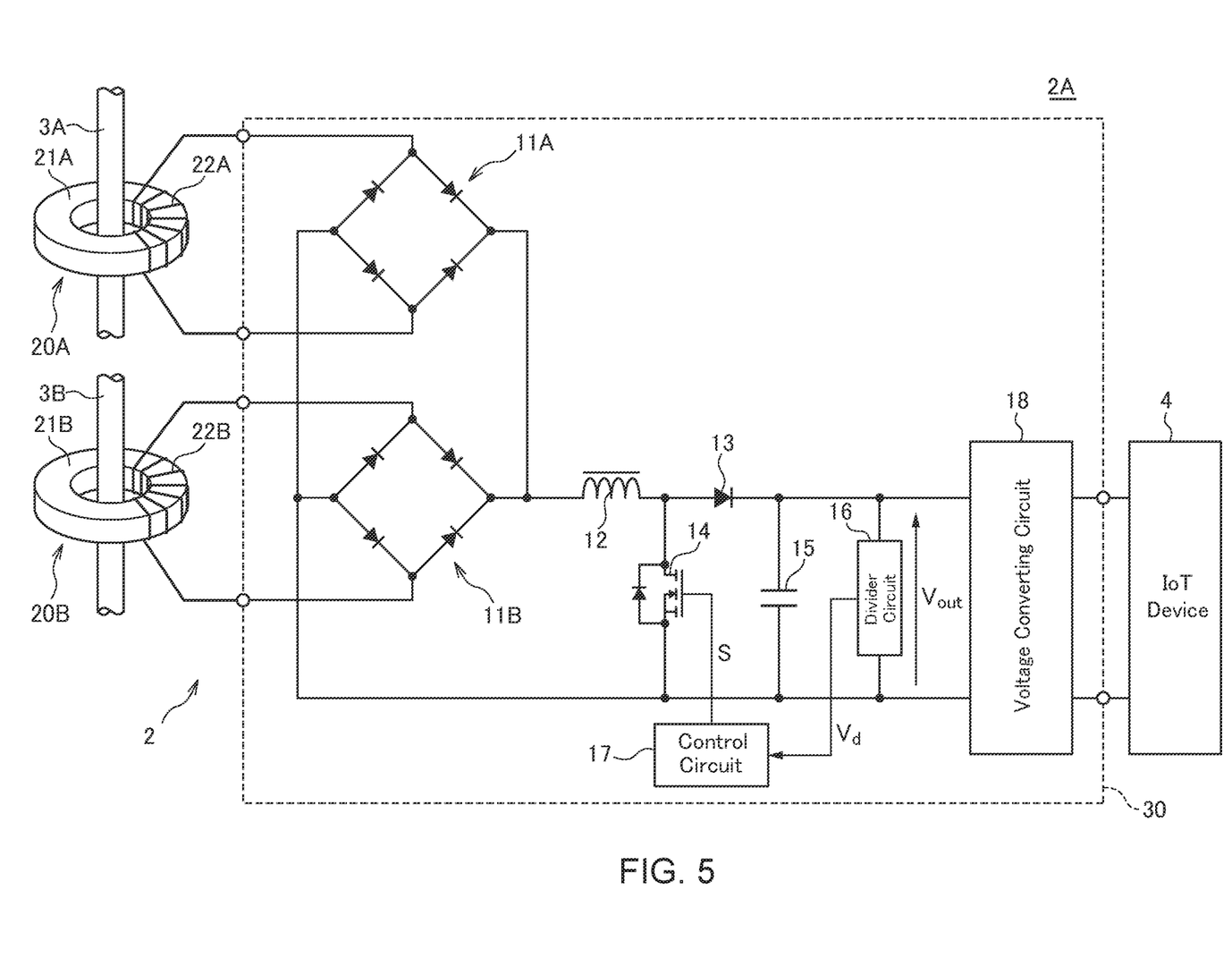
FIG. 5 is a view schematically illustrating the configuration of a power transmission/distribution line monitoring system 2A according to a second embodiment of the present invention.

FIG. 5 is a view schematically illustrating the configuration of a power transmission/distribution line monitoring system 2A according to a second embodiment of the present invention.

As illustrated in FIG. 5, the power transmission/distribution line monitoring system 2A according to the second embodiment has an electromagnetic induction power generator 2 that generates power with current flowing through two power transmission/distribution lines 3A and 3B and the IoT device 4 that receives power from the electromagnetic induction power generator 2 and monitors the power transmission/distribution line 3. Current transformers 20A and 20B are provided respectively for the power transmission/distribution lines 3A and 3B. The current transformers 20A and 20B respectively have magnetic cores 21A, 21B and power generating coils 22A, 22B wound around the magnetic cores 21A, 21B. Both ends of the power generating coil 22A are connected to a rectifying circuit 11A included in a switching power supply circuit 30, and both ends of the power generating coil 22B are connected to a rectifying circuit 11B included in the switching power supply circuit 30.

Outputs of the rectifying circuits 11A and 11B are connected in parallel, whereby the switching power supply circuit 30 synthesizes and converts AC appearing at both ends of each of the power generating coils 22A and 22B into DC. Other basic configurations are the same as those of the power transmission/distribution line monitoring system 1A according to the first embodiment, so the same reference numerals are given to the same elements, and overlapping description will be omitted.

According to the present embodiment, the switching power supply circuit 30 has two input power supplies, so that even if the current flowing through one of the power transmission/distribution lines 3A and 3B stops, or even if one of the current transformers 20A and 20B fails, the power generating operation, i.e., the supply of active power can be continued. Thus, there can be provided a power transmission/distribution line monitoring system having higher reliability.

The phases of the current flowing through one of the power transmission/distribution lines 3A and 3B may differ from each other. In this case, the phases of the AC appearing at both ends of the power generating coil 22A and AC appearing at both ends of the power generating coil 22B are out of phase, making the pulsating voltage Vp smoother, which allows more stable DC to be obtained.

While the preferred embodiment of the present disclosure has been described, the present disclosure is not limited to the above embodiment, and various modifications may be made within the scope of the present disclosure, and all such modifications are included in the present disclosure.

REFERENCE SIGNS LIST 1, 2 electromagnetic induction power generator
1A, 2A power transmission/distribution line monitoring system
3, 3A, 3B power transmission/distribution line
4 IoT device
10, 30 switching power supply circuit
11, 11A, 11B rectifying circuit
12 choke coil
13 diode
14 transistor
15 capacitor
16 divider circuit
17 control circuit
18 voltage converting circuit
20, 20A, 20B current transformer
21, 21A, 21B magnetic core
22, 22A, 22B power generating coil

What is claimed is:

1. An electromagnetic induction power generator comprising:
    a magnetic core attachable to a power transmission/distribution line;
    a generating coil wound around the magnetic core; and
    a switching power supply circuit that converts AC power appearing at both ends of the generating coil into DC power,
    wherein the switching power supply circuit includes a control circuit that stops a switching operation based on a voltage level of the DC power, and
    wherein the control circuit is further configured to control the switching power supply circuit such that:
        the switching power supply circuit intermittently performs the switching operation in response to a voltage level of the DC power exceeding a first predetermined value to increase a reactive power;
        the switching power supply circuit that includes a voltage converting circuit controls the voltage converting circuit to convert the voltage level of the DC power and supply a resultant DC power to an IoT device; and
        the switching power supply circuit adjusts the reactive power such that a total of power loss of the voltage converting circuit and load power consumed by the IoT device is equal to an active power.

2. The electromagnetic induction power generator as claimed in claim 1, wherein the control circuit is configured to control the switching power supply circuit that includes a rectifying circuit such that the rectifying circuit rectifies the AC power into a pulsating voltage and stops the switching operation in a period during which a voltage level of the pulsating voltage exceeds a second predetermined value in response to the voltage level of the DC power exceeding the first predetermined value.

3. The electromagnetic induction power generator as claimed in claim 1,
wherein the magnetic core includes a first magnetic core attachable to a first power transmission/distribution line and a second magnetic core attachable to a second power transmission/distribution line,
wherein the generating coil includes a first generating coil wound around the first magnetic core and a second generating coil wound around the second magnetic coil, and
wherein the control circuit is configured to control the switching power supply circuit such that the switching power supply circuit synthesizes and converts AC power appearing at both ends of each of the first and second generating coils into DC power.

4. The electromagnetic induction power generator as claimed in claim 3, wherein phases of the AC power appearing at both ends of the first generating coil and the AC power appearing at both ends of the second generating coil differ from each other.

5. The electromagnetic induction power generator as claimed in claim 2,
wherein the control circuit is further configured to control the switching power supply circuit that includes a voltage converting circuit such that the voltage converting circuit converts the voltage level of the DC power and supplies a resultant DC power to an IoT device, and
wherein the switching power supply circuit adjusts the reactive power such that a total of power loss of the voltage converting circuit and load power consumed by the IoT device is equal to an active power.

* * * * *